(12) United States Patent
Ainspan et al.

(10) Patent No.: US 7,498,894 B1
(45) Date of Patent: Mar. 3, 2009

(54) VARACTOR SYSTEM HAVING REAL OR APPARENT LOW CAPACITANCE DENSITY

(75) Inventors: Herschel Akiba Ainspan, New Hempstead, NY (US); Daniel Joseph Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/204,622

(22) Filed: Sep. 4, 2008

(51) Int. Cl.
*H03B 5/08* (2006.01)
*H03B 5/12* (2006.01)

(52) U.S. Cl. .................. 331/179; 331/177 V

(58) Field of Classification Search ............... 331/36 C, 331/117 R, 117 FE, 117 D, 177 R, 177 V, 331/179
See application file for complete search history.

(56) References Cited

U.S. PATENT DOCUMENTS

| 4,602,222 | A | 7/1986 | Wynn | 331/179 |
| 7,084,713 | B2 | 8/2006 | Peluso | 331/179 |
| 7,116,183 | B2 | 10/2006 | Wu | 331/176 |
| 2006/0114074 | A1* | 6/2006 | Matsui et al. | 331/177 V |
| 2007/0241834 | A1 | 10/2007 | Lee | 331/177 |
| 2008/0136544 | A1 | 6/2008 | Tang | 331/177 |

OTHER PUBLICATIONS

U.S. Appl. No. 12/175,012 filed on Jul. 17, 2008.

* cited by examiner

*Primary Examiner*—David Mis
(74) *Attorney, Agent, or Firm*—Zilka-Kotab, PC

(57) ABSTRACT

A system in one embodiment includes a voltage controlled oscillator; at least two varactors coupled to a tank node, each of the varactors being of a different physical size, the tank node being coupled to the voltage controlled oscillator; and switches for selectively turning the varactors on and off, wherein switching a first of the varactors from off to on and a second of the varactors from on to off creates a capacitance step of less than about 10 fF thereby tuning the voltage controlled oscillator from a first state to a second state.

1 Claim, 3 Drawing Sheets

VARACTOR SYSTEM HAVING REAL OR APPARENT LOW CAPACITANCE DENSITY

BACKGROUND

The present invention generally relates to low density varactors.

On-chip variable capacitors (varactors) are widely used in integrated circuits for clocking and I/O applications, e.g. inductor-varactor voltage-controlled oscillators (LC VCOs) to provide a stable desired frequency, or impedance-matching circuits to reduce signal loss at chip inputs or outputs. Tuning is achieved by varying a control voltage input to the varactor, to change the capacitance value between a low and a high value. These varactors typically have high capacitance density (capacitance per unit area) to allow implementation of large capacitance values in a small chip area. Tuning such high-density varactors between the low-capacitance and high-capacitance states results in a large capacitance step, thus causing a large frequency step in an LC VCO, for example. Some circuit applications require a small frequency step, e.g. a digital PLL with separate proportional and integral feedback paths. Here the proportional path gain should be very small (kHz steps) compared to the integral path gain (MHz steps). The integral path is typically implemented using the high-density varactors. However, the proportional path needs a device that allows a small frequency step. Prior art solutions to achieve these small frequency steps include using an array of the smallest size high-density varactor allowed by the semiconductor process technology. However, such a solution requires a large chip area and adds large wiring parasitics to the varactor which reduces the VCO tuning range.

An example of prior art to achieve a small frequency step is shown in FIG. 1. A high-density varactor 100 having the smallest size allowed by the technology is connected to the tuned circuit node (e.g. the resonant tank node of LC VCO), and a digital control (CAP_HI) is set to 1 to provide the maximum capacitance on the tank node, or 0 to provide the minimum capacitance. An array of these varactors is connected in parallel to provide the desired total capacitance. The disadvantages of this method are the large chip area required for the array and the large wiring parasitics of the array. This wiring parasitic is a fixed-value capacitance that reduces the tuning range of the VCO.

SUMMARY

A system in one embodiment includes a voltage controlled oscillator; at least two varactors coupled to a tank node, each of the varactors being of a different physical size, the tank node being coupled to the voltage controlled oscillator; and switches for selectively turning the varactors on and off, wherein switching a first of the varactors from off to on and a second of the varactors from on to off creates a capacitance step of less than about 10 fF thereby tuning the voltage controlled oscillator from a first state to a second state.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description describes low-density varactors and effective low-density varactors. Two preferred embodiments are described. The first, a metal-to-metal type of varactor, uses metal overlap for capacitance and a transistor, e.g., a series FET, for control input. The parasitic wire capacitance provides a very small capacitance and a transistor on/off switch provides the tuning capability. The second type is effectively a low-density varactor formed by pair-wise switching of high-density varactors of slightly different sizes. Either implementation provides very fine tuning (kHz steps).

Figure 1:
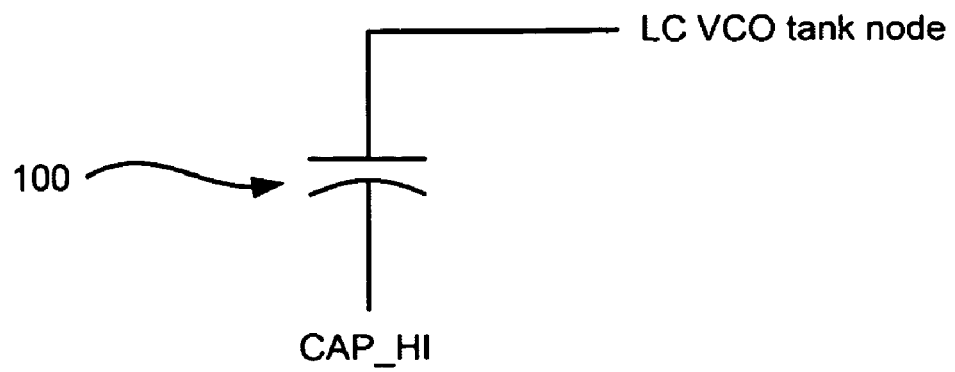
FIG. 1 is a schematic of the prior art, using a minimum-size high-density varactor to provide a small frequency step.
Figure 2:
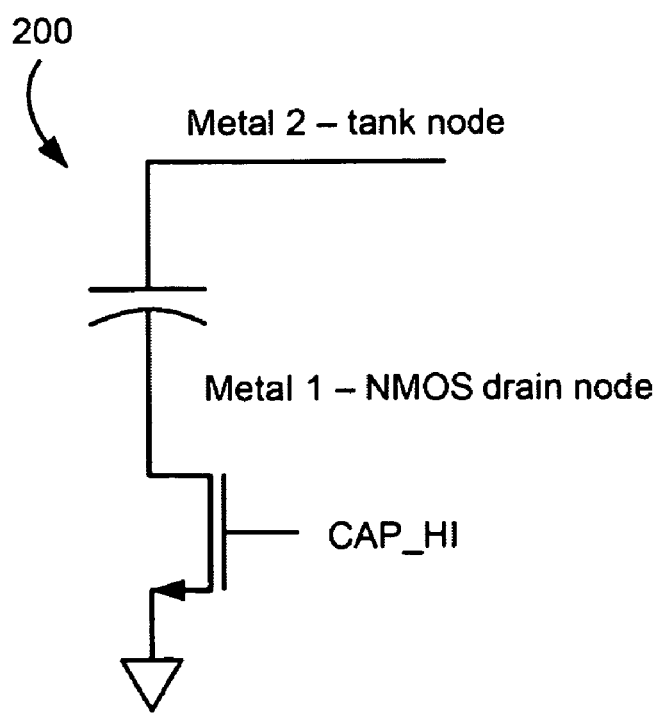
FIG. 2 is a schematic of an illustrative vertical implementation of the MIM cap according to one embodiment of the invention.
Figure 3:
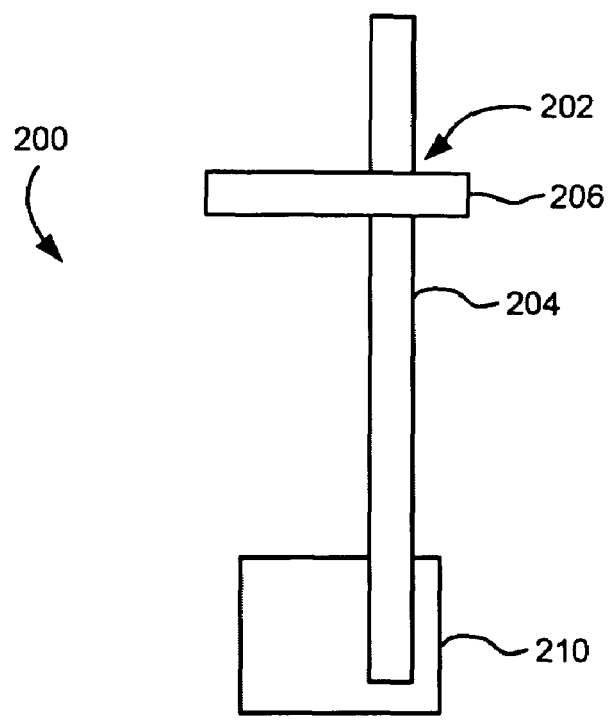
FIG. 3 is a layout of an illustrative vertical implementation of the MIM cap according to one embodiment of the invention.

FIGS. 2 and 3 show a schematic and a layout, respectively, of a vertical implementation of a metal-to-metal, or MIM cap, embodiment 200 according to one embodiment of the present disclosure. The MIM cap is formed at the intersection 202 of a metal-1 wire 204 and a metal-2 wire 206 separated by an insulator (not shown). In FIG. 2, the metal-1 wire is labeled "NMOS drain node" and the metal-2 wire is labeled "tank node". Since the metal-1 wire is below the metal-2 wire, this arrangement may be referred to as a vertical implementation.

Illustrative metals usable for the wires include conventional materials such as, but not limited to, gold, copper, aluminum, etc. The insulator may be formed of common or specialty insulating materials, such as but not limited to metal oxides, polymers, laminates, composites, etc. The implementation is not limited to particular metals 1 and 2, and can use any pair of adjacent metals, e.g. metals 3 and 4, or even a stack of interleaved layers, e.g. one conductor formed by a shunt connection of metals 1 and 3 and the other formed by a shunt connection of metals 2 and 4, the metal layers being numbered in order of increasing height above the silicon device layer.

The on/off tuning of this MIM cap may be achieved by the NMOS device 210 shown in FIG. 3. The NMOS device may have a source node connected to ground, drain node connected to the metal-1 wire of the MIM cap, and gate node connected to the digital control input CAP_HI. A PMOS device could alternatively be used, having source node connected to the positive voltage supply.

On/off tuning is controlled by the CAP_HI input. When CAP_HI=0, the metal-1 layer is floating, and the capacitance added to the metal-2 node is minimum. When CAP_HI=1, the metal-1 wire is shorted to ground through the NMOS device, and the capacitance added to the metal-2 wire is maximum. The structure can be repeated to form an array to provide the desired total capacitance and number of bits of control.

This method provides significant advantages over the prior art. For example, the capacitance difference between the CAP_HI=0/1 states can be very small (sub-fF), for very fine tuning (Hz steps). Also, the layout occupies a very small area, enabling the use of large arrays of such cells to compensate for process variation of the metal-1/metal-2 wire capacitance. Moreover, the on-resistance of the MOS switch is not a concern for overall quality factor (Q) of the resonant tank circuit, since this varactor provides a very small fraction of the total tank capacitance.

Figure 4:
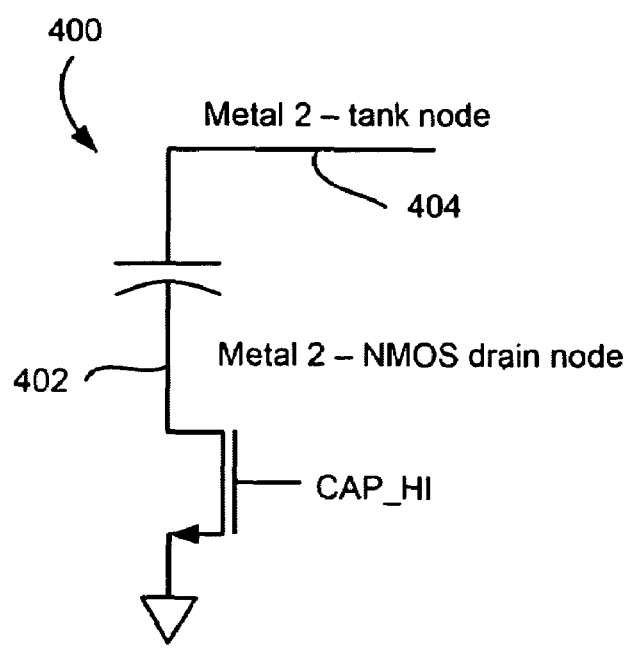
FIG. 4 is a schematic of an illustrative horizontal implementation of the MIM cap according to one embodiment of the invention.
Figure 5:
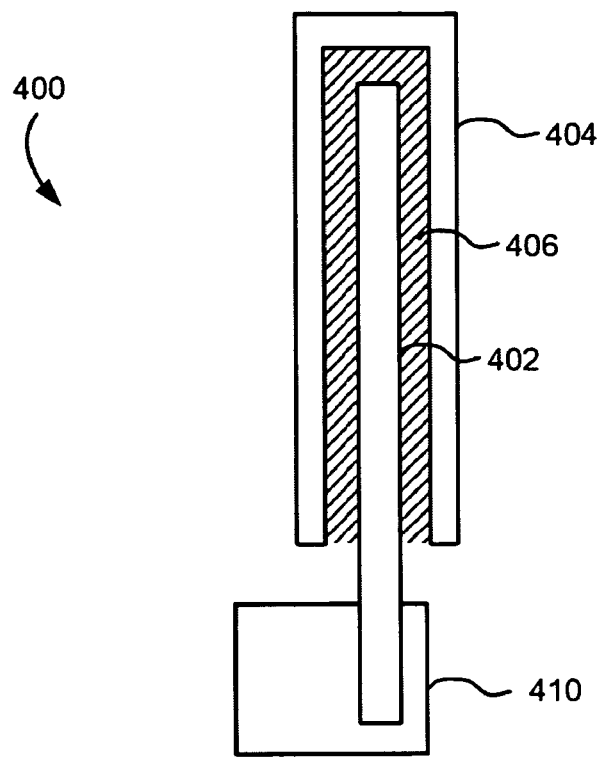
FIG. 5 is a layout of an illustrative horizontal implementation of the MIM cap according to one embodiment of the invention.

FIGS. 4 and 5 show a schematic and layout, respectively, of a horizontal implementation 400 of the MIM cap embodiment according to one embodiment. The MIM cap is formed by the lateral capacitive coupling of the two metal-2 conductors 402, 404, one labeled "NMOS drain node" and the other "tank node" in FIG. 4. The regions of capacitance are indicated by the cross-hatched area labeled 406 in the layout of FIG. 5. Since the MIM is formed by two conductors on the same metal layer, this is called a horizontal implementation. The implementation is not limited to metal-2, and can use any metal layer. The implementation can be extended to multiple interdigitated fingers of drain and tank nodes to achieve higher capacitance on each NMOS switch 410.

The horizontal implementation has similar switching of the capacitance by the CAP_HI input as the vertical implementation and has similar advantages over the prior art. Additionally, the horizontal implementation may have lower process variation than the vertical one, as follows. In either implementation, the capacitance value depends on the thickness of the dielectric insulator between the metal conductors. In advanced chip technologies, the horizontal distance between wires, which is determined by lithography, often shows less variation than the vertical distance between wires, which is determined by dielectric film thickness. In such a case, the horizontal implementation may be preferred.

Figure 6:
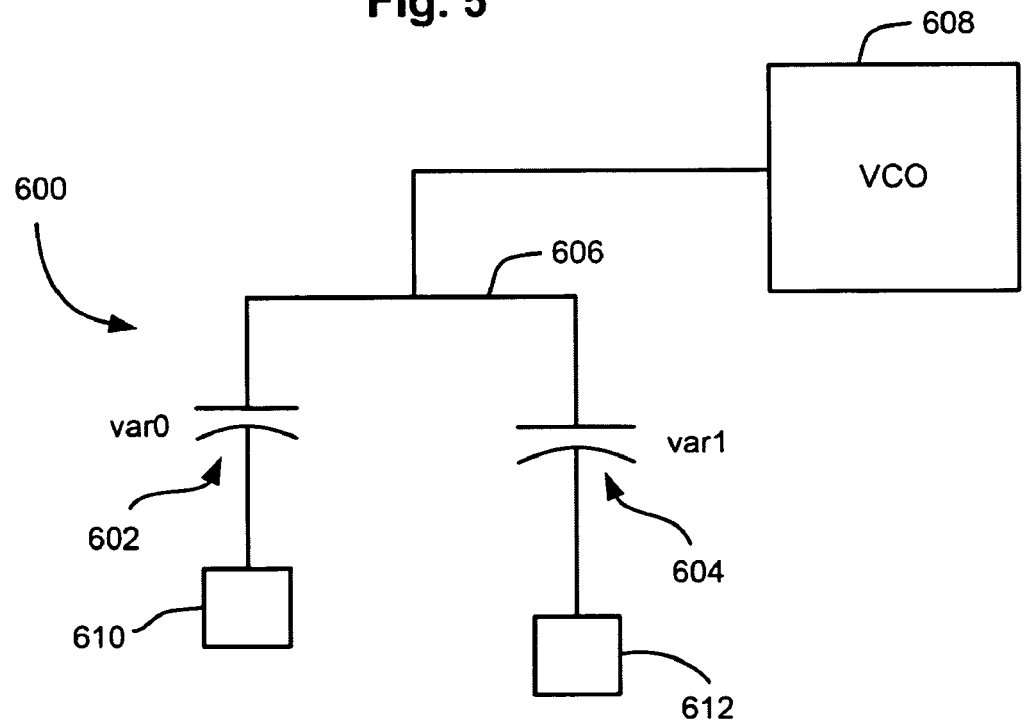
FIG. 6 is a schematic and layout of an illustrative implementation of the differencing cap according to one embodiment of the invention

The second type of low-density varactor is referred to as a "differencing varactor" 600, an example of which is shown in FIG. 6. Two or more high-density varactors (var0, var1) 602, 604 of slightly different physical sizes (var0<var1) are connected to the tank node 606, which may in turn be coupled to a voltage controlled oscillator (VCO) 608, e.g., a LC VCO of known type. In one example, provided by way of example only, the var0 physical width=0.50 μm and var1 physical width=0.51 μm. Keep in mind that other values for any dimension of the varactors can be used, as long as the capacitance of var0 and var1 are different.

Switches 610, 612 may be used for selectively turning the varactors on and off. In one approach, the digital control word CAP_HI<0:1> is toggled between two states to achieve capacitance tuning:

CAP_HI<0:1>=(0,1) var0 off, var1 on–higher capacitance
CAP_HI<0:1>=(1,0) var0 on, var1 off–lower capacitance.

Using the illustrative example above, where the var0 physical width=0.50 μm and var1 physical width=0.51 μm, the change in capacitance is effectively about equivalent to the capacitance that would be provided by a 0.01 μm varactor (if such a varactor could be made).

Accordingly, switching var0 from off to on and var1 from on to off creates a capacitance step that tunes the voltage controlled oscillator from a first state to a second state. For instance, the change in state may be a step of about several hundred hertz, preferably in a step less than one Megahertz (MHz). Known techniques to tune a VCO may be used, as modified to use the novel teachings set forth herein.

The capacitance step between these two states can be very small (e.g., less than about 10 fF, more preferably less than about 6 fF, e.g., about 4 fF), limited only by the process lithography (e.g. the 0.01 um difference in device widths in the example above) and the varactor device capacitance density (lower density will allow a smaller capacitance step).

The differencing cap system and method can be extended to use more than two varactors to allow different sizes of capacitance steps.

Following is an exemplary implementation of the differencing varactor, using a total of 8 bits instead of 2 as in the previous example.

To expand the concept from the 2 bit configuration shown in FIG. 6, CAP_HI<0:1> to 8 bits, CAP_HI<0> will hereafter be called CAPP<0:3> (4 bits) and CAP_HI<1> is hereafter called CAPN<0:3> (4 bits). CAPP<0:3> are all of equal weight (refer to this as a capacitance value of 1 in arbitrary units) and CAPN<0:3> are of increasing binary weight, i.e., CAPN<0>=1+x, CAPN<1>=1+2x, CAPN<2>=1+4x, CAPN<3>=1+8x. Note that x is preferably a very small value to provide small incremental steps. Thus, capacitance steps of values x, 2x, 3x, 4x . . . , 15x, etc. can be achieved as shown in Table 1.

In Table 1, note the CAPP<0:3> and CAPN<0:3> bits are listed left to right in the order CAPP<0>, CAPP<1>, CAPP<2>, CAPP<3> and CAPN<0>, CAPN<1>, CAPN<2>, CAPN<3>, e.g., the first row below means CAPP<0>=1, CAPP<1>=0, CAPP<2>=0, CAPP<3>=0, and CAPN<0>, CAPN<1>, CAPN<2>, CAPN<3> are all=0.

TABLE

|  | CAPP<0:3> | CAPN<0:3> | total capacitance value |
|---|---|---|---|
| initial | 1000 | 0000 | 1 + 0 |
| final | 0000 | 1000 | 0 + 1 + x delta is (1 + x) − 1 = x |
| initial | 0100 | 0000 | 1 |
| final | 0000 | 0100 | 1 + 2x delta is 2x |
| initial | 1100 | 0000 | 2 |
| final | 0000 | 1100 | 2 + 3x delta is 3x |
| initial | 0010 | 0000 | 1 |
| final | 0000 | 0010 | 1 + 4x delta is 4x |
| initial | 1010 | 0000 | 2 |
| final | 0000 | 1010 | 2 + 5x delta is 5x |
| initial | 0110 | 0000 | 2 |
| final | 0000 | 0110 | 2 + 6x delta is 6x |
| initial | 1110 | 0000 | 3 |
| final | 0000 | 1110 | 3 + 7x delta is 7x |
| initial | 0001 | 0000 | 1 |
| final | 0000 | 0001 | 1 + 8x delta is 8x |
| initial | 1001 | 0000 | 2 |
| final | 0000 | 1001 | 2 + 9x delta is 9x |
| initial | 0101 | 0000 | 2 |
| final | 0000 | 0101 | 2 + 10x delta is 10x |
| initial | 1101 | 0000 | 3 |
| final | 0000 | 1101 | 3 + 11x delta is 11x |
| initial | 0011 | 0000 | 2 |
| final | 0000 | 0011 | 2 + 12x delta is 12x |
| initial | 1011 | 0000 | 3 |
| final | 0000 | 1011 | 3 + 13x delta is 13x |
| initial | 0111 | 0000 | 3 |
| final | 0000 | 0111 | 3 + 14x delta is 14x |
| initial | 1111 | 0000 | 4 |
| final | 0000 | 1111 | 4 + 15x delta is 15x |

For example, to achieve a capacitance step of x, the system switches between an initial state of CAPP<0:3>=1000 and CAPN<0:3>=0000 to a final state of CAPP<0:3>=0000 and CAPN<0:3>=1000. In the initial state, the capacitance on CAPP<0:3> is 1 (arbitrary units) and the capacitance on CAPN<0:3> is 0, summing to a total capacitance of 1+0=1. In the final state, the capacitance on CAPP<0:3> is 0 and the capacitance on CAPN<0:3> is 1+x, summing to a total capacitance of 0+1+x=1+x. The change, or delta, in capacitance between the initial and final states is 1+x−1=x, giving the desired capacitance step of x.

As a second example, to achieve a capacitance step of 5x, the system switches between an initial state of CAPP<0:3>=1010 and CAPN<0:3>=0000 to a final state of CAPP<0:3>=0000 and CAPN<0:3>=1010. In the initial state, the capacitance on CAPP<0:3> is 2 (arbitrary units) and the capacitance on CAPN<0:3> is 0, summing to a total capacitance of 2+0=2. In the final state, the capacitance on CAPP<0:3> is 0 and the capacitance on CAPN<0:3> is 2+5x, summing to a total capacitance of 0+2+5x=2+5x. The delta in capacitance between the initial and final states is 2+5x−2=5x, giving the desired capacitance step of 5x.

There have thus been described several systems that may be used to provide enhancements in tuned resonator circuits, e.g. in phase-locked loops and high-speed input/output (I/O) circuits. In one illustrative example of use, the tank node of the various embodiments can be coupled to a VCO, e.g., an LC VCO. The change in capacitance on the tank node adjusts the frequency of the VCO.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
a voltage controlled oscillator;
at least two varactors coupled to a tank node, each of the varactors being of a different physical size, the tank node being coupled to the voltage controlled oscillator; and
switches for selectively turning the varactors on and off,
wherein switching a first of the varactors from off to on and a second of the varactors from on to off creates a capacitance step of less than about 10 fF thereby tuning the voltage controlled oscillator from a first state to a second state.

* * * * *